United States Patent [19]

Haseo

[11] Patent Number: 5,663,926
[45] Date of Patent: Sep. 2, 1997

[54] SEMICONDUCTOR DEVICE HAVING AN INTERNAL VOLTAGE STEP-UP CONTROL CIRCUIT

[75] Inventor: Eiji Haseo, Tokyo, Japan

[73] Assignee: NEC Corporation, Tokyo, Japan

[21] Appl. No.: 594,239

[22] Filed: Jan. 30, 1996

[30] Foreign Application Priority Data

Jan. 30, 1995 [JP] Japan ................................ 7-013156

[51] Int. Cl.$^6$ ............................................. G11C 7/00
[52] U.S. Cl. ................. 365/230.06; 365/226; 365/189.11
[58] Field of Search ...................... 365/189.09, 226, 365/230.06, 189.11, 185.23

[56] References Cited

U.S. PATENT DOCUMENTS 5,103,113  4/1992  Inui et al. ............................ 365/226 X

FOREIGN PATENT DOCUMENTS 62-177787  8/1987  Japan .

Primary Examiner—Joseph A. Popek
Attorney, Agent, or Firm—Whitham, Curtis, Whitham & McGinn

[57] ABSTRACT

In a semiconductor memory device, a power supply voltage detecting circuit receives a power supply voltage for outputting a detection signal which is activated when the power supply voltage is not higher than a reference level and which is deactivated when the power supply voltage is higher than a reference level, and a voltage step-up circuit receives the power supply voltage for supplying a stepped-up voltage. A voltage selection circuit receives the power supply voltage and the stepped-up voltage and is controlled by the detection signal to supply the stepped-up voltage to a word line of the memory when the detection signal is active and the power supply voltage to the word line of the memory when the detection signal is inactive.

20 Claims, 5 Drawing Sheets

101 POWER SUPPLY VOLTAGE DETECTING CIRCUIT

103 VOLTAGE SELECTING CIRCUIT

SEMICONDUCTOR DEVICE HAVING AN INTERNAL VOLTAGE STEP-UP CONTROL CIRCUIT

BACKGROUND OF THE INVENTION

1. Field of the invention

The present invention relates to a semiconductor device, and more specifically a semiconductor device having therein a voltage step-up control circuit.

2. Description of related art

Recently, an operating voltage range of semiconductor memories is ordinarily of 5.0 V±10%, but an operating voltage range of low voltage driven semiconductor memories is ordinarily 3.0 V±10% or 3.3 V±10%. In addition, the low voltage driven semiconductor memories are provided with a voltage step-up control circuit for stepping up a voltage to be applied to word lines of the memory, to a voltage higher than a power supply voltage supplied from an external.

However, this conventional voltage step-up control circuit is so configured to step up a word line voltage whatever power supply voltage is supplied, and therefore, there often occurs a problem of unreliability such as breakdown of a gate oxide film of a semiconductor MOS transistor used in the memory.

In order to avoid this problem, for example, Japanese Patent Application Laid-open Publication No. Showa 62-177787 proposed a voltage step-up control circuit so configured to detect a change of a power supply voltage, and to change a voltage step-up amount for the word line voltage in such a manner when the power supply voltage is high, the voltage step-up amount is made small so as to prevent an excessive large voltage from being applied to the word line.

Now, this proposed voltage step-up control circuit will be described with the drawings:

Referring to FIG. 1, the proposed voltage step-up control circuit includes a power supply voltage detecting circuit 61 outputting a power supply voltage detection signal φ4, a word line voltage step-up circuit 62 receiving the power supply voltage detection signal φ4 and a voltage voltage step-up start signal φ3 and outputting an output voltage V2, and a word line selecting circuit 63 receiving the output voltage V2. The power supply voltage detecting circuit 61 is configured to detect a voltage of a power supply and to output the power supply voltage detection signal φ4 for controlling a charging time of a voltage step-up capacitor (not shown in FIG. 1) internally provided in the word line voltage step-up circuit 62, in such a manner that when the power supply voltage is high, the charging time is shortened, and when the power supply voltage is not higher than an ordinary level, the charging time is elongated, with the result that a range of a usable operating voltage is increased.

Next, the proposed voltage step-up control circuit will be described in detail.

Referring to FIG. 2, the power supply voltage detecting circuit 61 includes P-channel transistors 29 and 32 and N-channel transistors 30, 31 and 33, which are connected as shown. The transistors 29, 30 and 31 are connected in series between the power supply voltage Vcc and ground in the named order so as to generate, at a connection node between the transistors 29 and 30, a reference voltage VREF which constitutes a reference for the power supply voltage. This reference voltage VREF depends upon a threshold of the transistors 30 and 31, but is independent of the power supply voltage Vcc.

The transistors 32 and 33 are connected in series between the power supply voltage Vcc and the ground in the named order in the form of a CMOS inverter. Gates of the transistors 32 and 33 are connected in common to receive the reference voltage VREF, so that the transistors 32 and 33 are controlled by the reference voltage VREF generated by the transistors 29, 30 and 31. Drains of the transistors 32 and 33 are connected in common to generate the power supply voltage detection signal φ4 indicative of the result of the comparison between the reference voltage VREF and the power supply voltage Vcc. Thus, when the power supply voltage Vcc is higher than the reference voltage VREF, the power supply voltage detection signal φ4 is brought to a high level, and when the power supply voltage Vcc is not higher than the reference voltage VREF, the power supply voltage detection signal φ4 is brought to a low level.

Referring to FIG. 3, the word line voltage step-up circuit 62 includes buffers 34 and 36, a voltage step-up capacitor 35, a NOR circuit 42 and a delay selection circuit 43 having a pair of delay circuits 40 and 41, which are connected as shown. Specifically, the buffer 34 has an input receiving the voltage step-up start signal φ3 and an output connected to one end of the voltage step-up capacitor 35 so as to charge the voltage step-up capacitor 35 from the one end of the capacitor 35. The output of the buffer 34 is also connected to an output of the word line voltage step-up circuit 62 for outputting the output voltage V2.

The delay selection circuit 43 includes a NAND circuit 38 having one input connected to receive the voltage step-up start signal φ3 and another input connected to receive through an inverter 37 the power supply voltage detection signal φ4, the delay circuit 40 having an input connected to an output of the NAND circuit 38 and an output connected one input of the NOR circuit 42, another NAND circuit 39 having one input connected to receive the voltage step-up start signal φ3 and another input connected to directly receive the power supply voltage detection signal φ4, and the delay circuit 41 having an input connected to an output of the NAND circuit 39 and an output connected the other input of the NOR circuit 42. Thus, the NOR circuit 42 outputs a delayed signal φ5 of the voltage step-up start signal φ3, and this delayed signal φ5 is applied to an input of the buffer 36, which in turn has an output connected to the other end of the voltage step-up capacitor 35 so as to charge the voltage step-up capacitor 35 from the other end of the capacitor 35.

Now, operation of this voltage step-up circuit 62 will be described. When the voltage step-up starting signal φ3 is activated, the buffer 34 is driven to start the charging of the voltage step-up capacitor 35. Here, when the power supply voltage Vcc is higher than the ordinary supply voltage, since the power supply voltage detection signal φ4 is at the high level as mentioned above, the delay selection circuit 43 selects the delay circuit 40, so that the delayed signal φ5 of the voltage step-up starting signal φ3 outputted from the delay circuit 40 is applied through the NOR circuit 42 to the buffer 36. When the delayed signal φ5 changes from the high level to the low level, the voltage step-up operation is started.

On the other hand, when the power supply voltage Vcc is not higher than the ordinary supply voltage, since the power supply voltage detection signal φ4 is at the low level as mentioned above, the delay selection circuit 43 selects the delay circuit 41 which has a delay time longer than that of the delay circuit 40, so that the delayed signal φ5 of the voltage step-up starting signal φ3 outputted from the delay circuit 41 is applied through the NOR circuit 42 to the buffer 36. When this delayed signal φ5 changes from the high level to the low level, the voltage step-up operation is started, similarly to the case that the power supply voltage Vcc is higher than the ordinary supply voltage.

As seen from the above, when the power supply voltage Vcc is low, the delay circuit 41 having a long delay time is selected, so that a sufficient charging time is ensured for the voltage step-up capacitor 35. Thus, the potential of the word line can be sufficiently elevated. On the other hand, when the power supply voltage Vcc is high, the delay circuit 40 having a short delay time is selected, so that the charging time for the voltage step-up capacitor 35 is limited. Namely, the charging amount of the word line is limited so that the potential of the word line is elevated by only a small degree, and namely, the potential of the word line is restricted to a relatively low level.

As seen from the above, the conventional voltage step-up control circuit as mentioned above is configured to change the charging time of the voltage step-up capacitor, dependently upon whether or not the power supply voltage is higher than the ordinary supply voltage. In other words, even when the power supply voltage is sufficiently high, the potential step-up is carried out. Thus, if an excessive high voltage is applied to the word line, the gate oxide film of the semiconductor MOS transistor used in the memory is often broken.

SUMMARY OF THE INVENTION

Accordingly, it is an object of the present invention to provide a voltage step-up control circuit for a semiconductor device, which has overcome the above mentioned defect of the conventional one.

Another object of the present invention is to provide a voltage step-up control circuit for a semiconductor device, capable of avoiding application of an excessive voltage when the power supply voltage is sufficiently high.

The above and other objects of the present invention are achieved in accordance with the present invention by a semiconductor device comprising a power supply voltage detecting circuit receiving a power supply voltage for outputting a detection signal which is activated when the power supply voltage is not higher than a predetermined reference level and which is deactivated when the power supply voltage is higher than a predetermined reference level, a voltage step-up circuit receiving the power supply voltage for stepping up the power supply voltage in response to a voltage step-up start signal, so as to output a stepped-up voltage, and a voltage selection circuit receiving the power supply voltage and the stepped-up voltage and controlled by the detection signal to output the stepped-up voltage when the detection signal is active and the power supply voltage when the detection signal is inactive.

Specifically, an output of voltage selection circuit is connected to a word line of a static random access memory.

Preferably, the power supply voltage detecting circuit is configured to compare the power supply voltage with a first predetermined reference level when the power supply voltage changes from a low voltage to a high voltage, and to compare the power supply voltage with a second predetermined reference level when the power supply voltage changes from a high voltage to a low voltage, the first predetermined reference level being different from the second predetermined reference level.

According to a second aspect of the present invention, there is provided a semiconductor device comprising a voltage step-up control circuit receiving a power supply voltage for supplying a stepped-up voltage to at least one portion of an internal circuit, the voltage step-up control circuit being configured to supply the power supply voltage to the at least one portion of the internal circuit, in place of the stepped-up voltage, when the stepped-up voltage is higher than a predetermined reference level.

According to a third aspect of the present invention, there is provided a semiconductor memory comprising a voltage step-up control circuit receiving a power supply voltage for driving a word line with a stepped-up voltage, the voltage step-up control circuit being configured to drive the word line with the power supply voltage, in place of the stepped-up voltage, when the stepped-up voltage is higher than a predetermined reference level.

The above and other objects, features and advantages of the present invention will be apparent from the following description of preferred embodiments of the invention with reference to the accompanying drawings.

DESCRIPTION OF THE PREFERRED EMBODIMENTS

Figure 1:
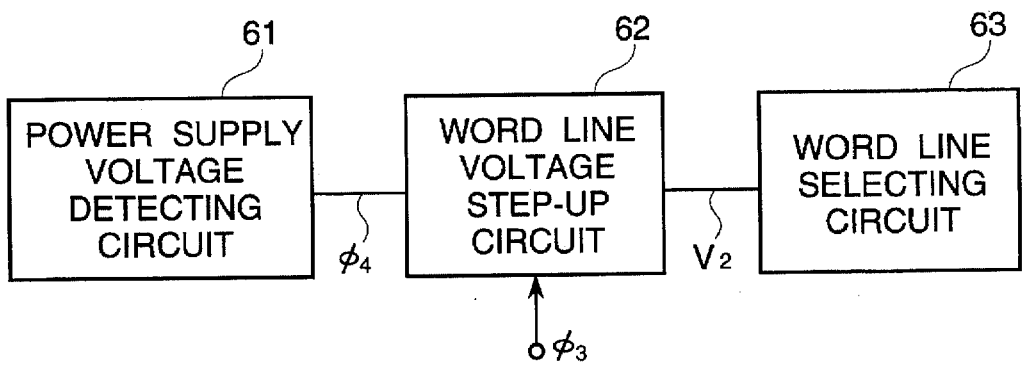
FIG. 1 is a block diagram of the conventional voltage step-up control circuit.
Figure 2:
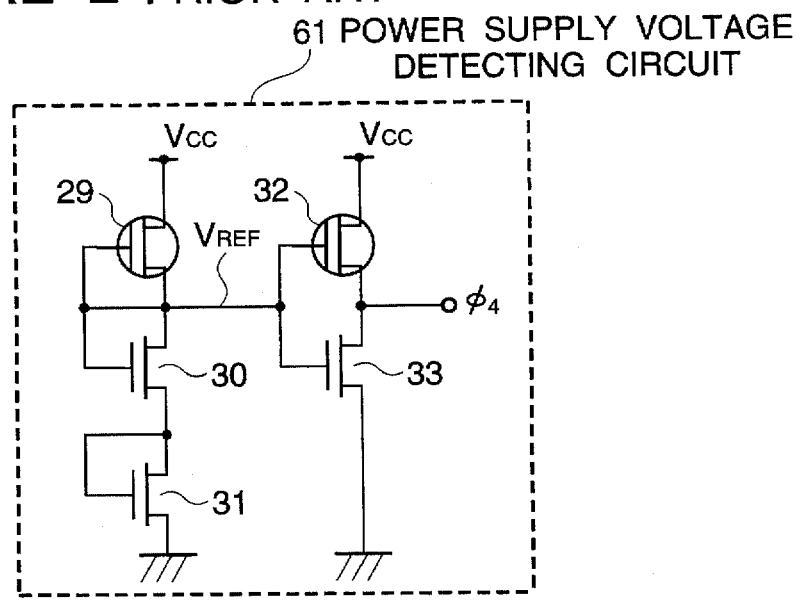
FIG. 2 is a circuit diagram of the power supply voltage detecting circuit used in the conventional voltage step-up control circuit shown in FIG. 1.
Figure 3:
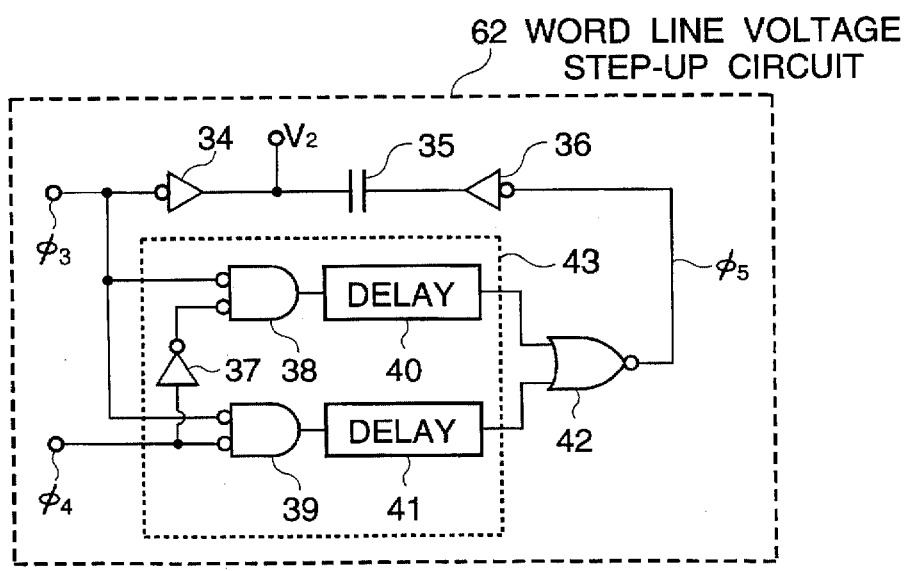
FIG. 3 is a circuit diagram of the word line voltage step-up circuit used in the conventional voltage step-up control circuit shown in FIG. 1.
Figure 4:
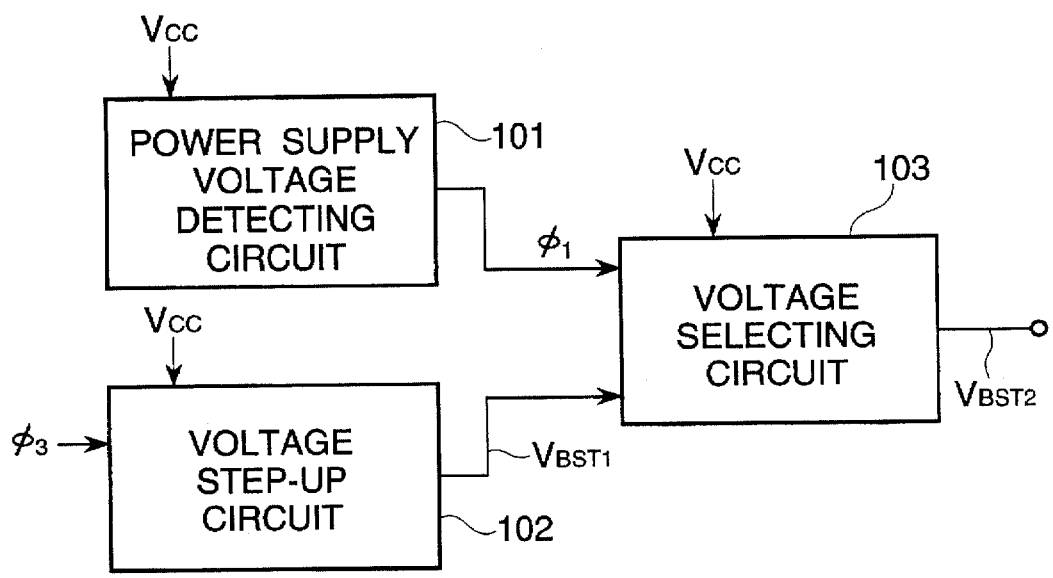
FIG. 4 is a block diagram of one embodiment of the voltage step-up control circuit in accordance with the present invention.

Referring to FIG. 4, there is shown a diagram of a block diagram of one embodiment of the voltage step-up control circuit in accordance with he present invention.

The shown voltage step-up control circuit includes a power supply voltage detecting circuit 101 receiving a power supply voltage Vcc for outputting a detection signal $\phi 1$ indicative of whether or not the power supply voltage Vcc is higher than a predetermined reference level, a voltage step-up circuit 102 receiving the power supply voltage Vcc and a voltage step-up start signal $\phi 3$, for supplying a stepped-up voltage VBST1, and a voltage selecting circuit 103 receiving the power supply voltage Vcc, the detection signal φ1 and the stepped-up voltage V$_{BST1}$, for supplying an output voltage V$_{BST2}$, which is supplied to for example a word line of a static random access memory.

In brief, only when the power supply voltage Vcc is not higher than the predetermined reference level, the power supply voltage detecting circuit 101 activates the detection signal φ1, and the voltage selecting circuit 103 responds to the activated detection signal φ1 to select the stepped-up voltage V$_{BST1}$ supplied from the voltage step-up circuit 102 and to supply the stepped-up voltage V$_{BST1}$ as the output voltage V$_{BST2}$. On the other hand, when the power supply voltage is higher than the predetermined reference level, the power supply voltage detecting circuit 101 deactivates the detection signal φ1, and the voltage selecting circuit 103 responds to the deactivated detection signal φ1 to select and output the power supply voltage Vcc as the output voltage V$_{BST2}$.

Figure 5A:
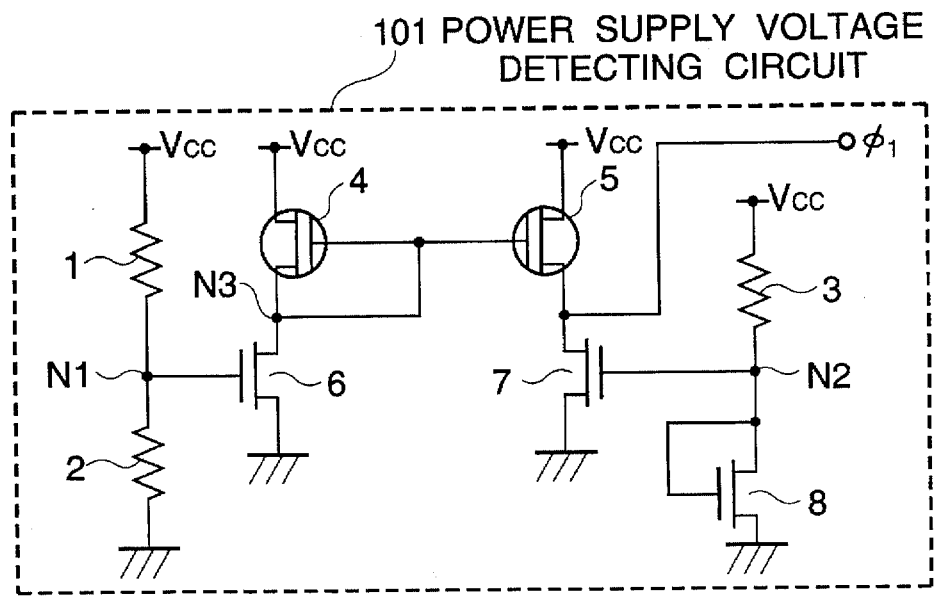
FIG. 5A is a circuit diagram of the power supply voltage detecting circuit used in the voltage step-up control circuit shown in FIG. 4.

Referring to FIG. 5A, the power supply voltage detecting circuit 101 includes load elements 1, 2 and 3, P-channel transistors 4 and 5, and N-channel transistors 6, 7 and 8, which are connected as shown.

Specifically, the load elements 1 and 2 are formed of for example resistors, respectively, and are connected in series between the power supply voltage Vcc and the ground in the named order. A connection node N1 between the load elements 1 and 2 is connected to a gate of the N-channel transistor 6. Therefore, the series-connected load elements 1 and 2 constitutes a resistance dividing circuit for generating a reduced voltage in proportion to the power supply voltage Vcc.

The P-channel transistor 4 and the N-channel transistor 6 are connected in series between the power supply voltage Vcc and the ground in the named order. In addition, a gate of the P-channel transistor 4 is connected at a node N3 to a drain of the P-channel transistor 4 itself and a drain of the N-channel transistor 6. The gate of the P-channel transistor 4 is also connected to a gate of the P-channel transistor 5.

The P-channel transistor 5 and the N-channel transistor 7 are connected in series between the power supply voltage Vcc and the ground in the named order. Furthermore, the load element 3, which is formed of for example a resistor, and the N-channel transistor 8, are connected in series between the power supply voltage Vcc and the ground in the named order. A connection node N2 between the load element 3 and the N-channel transistor 8 is connected to a gate of the N-channel transistor 7. A gate of the N-channel transistor 8 is connected to a drain of the N-channel transistor 8 itself. The detection signal φ1 is outputted from a connection node between the P-channel transistor 5 and the N-channel transistor 7.

Figure 5B:
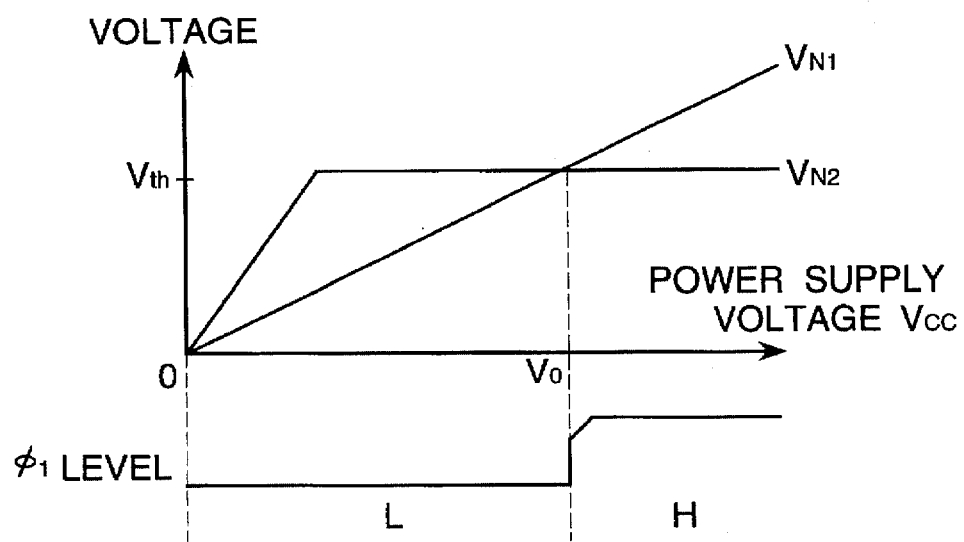
FIG. 5B is a waveform diagram illustrating an operation of the power supply voltage detecting circuit shown in FIG. 5A.

Referring to FIG. 5B, there is shown a waveform diagram illustrating an operation of the power supply voltage detecting circuit shown in FIG. 5A, assuming that the three N-channel transistors 6, 7 and 8 have the same threshold voltage Vth. In FIG. 5B, a line "V$_{N1}$" indicates the voltage on the node N1, which is in proportion to the power supply voltage Vcc, and a line "V$_{N2}$" indicates the voltage on the node N2. This voltage "V$_{N2}$" gradually linearly increases with increase of the power supply voltage Vcc until the power supply voltage Vcc exceeds the threshold Vth, but after the power supply voltage Vcc has exceeded the threshold Vth, the voltage "V$_{N2}$" becomes a constant value which is near to the threshold Vth. The power supply voltage Vcc at an intersection between the two lines "V$_{N1}$" and "V$_{N2}$" is a reference voltage Vo.

When the power supply voltage Vcc is not higher than the reference voltage Vo, the voltage V$_{N1}$ is lower than the threshold Vth, and therefore, the N-channel transistor 6 is off. At this time, therefore, the voltage on the node N3 is at the high level, so that the P-channel transistors 4 and 5 are off. Accordingly, the low level is outputted as the detection signal φ1.

On the other hand, when the power supply voltage Vcc is higher than the reference voltage Vo, the N-channel transistor 6 is turned on, so that the voltage on the node N3 drops and the P-channel transistors 4 and 5 are turned on. At this time, the voltage of the detection signal φ1 is determined by a division ratio between respective on-resistances of the P-channel transistor 5 and the N-channel transistor 7. Therefore, by making the on-resistance of the N-channel transistor 7 sufficiently larger than the on-resistances of the P-channel transistor 5, the detection signal φ1 of the high level is outputted.

Figure 6:
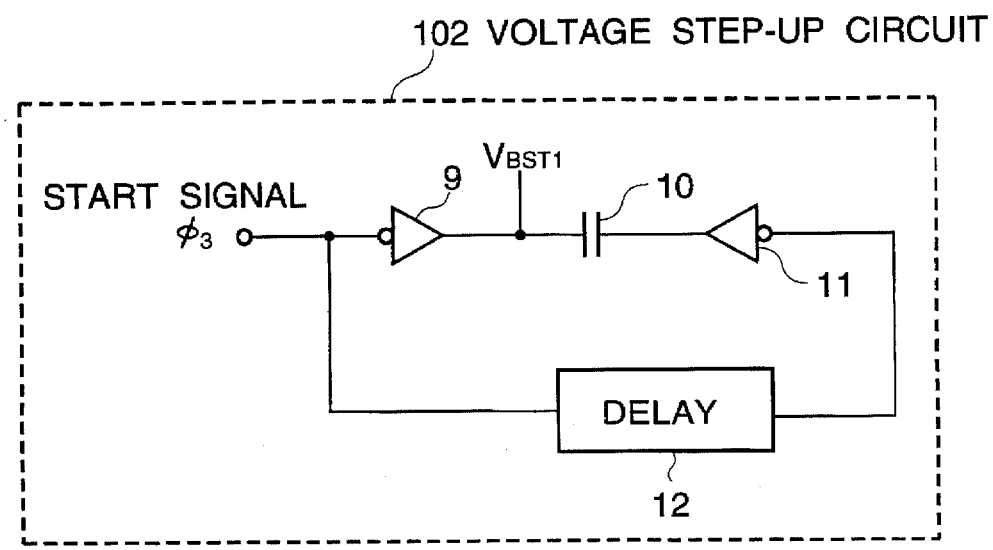
FIG. 6 is a circuit diagram of the voltage step-up circuit used in the voltage step-up control circuit shown in FIG. 4.

Referring to FIG. 6, there is shown a circuit diagram of the voltage step-up circuit 102 used in the voltage step-up control circuit shown in FIG. 4.

The shown voltage step-up circuit 102 includes a buffer 9 having an input receiving the voltage step-up start signal φ3 and an output connected to one end of a voltage step-up capacitor 10 so as to charge the voltage step-up capacitor 10 from the one end of the capacitor 10. The output of the buffer 9 is also connected to an output of the word line voltage step-up circuit 102 for outputting the output voltage V$_{BST1}$. The voltage step-up start signal φ3 is also applied through a delay circuit 12 to an input of another buffer 11, which in turn has an output connected to the other end of the voltage step-up capacitor 10 so as to charge the voltage step-up capacitor 10 from the other end of the capacitor 10.

Thus, when the voltage step-up start signal φ3 is activated, the buffer 9 is driven to charge the capacitor 10. The delay circuit 12 outputs a delay signal of the activated voltage step-up start signal φ3 to the buffer 11, so that the buffer 11 charges the capacitor 10 from the other end side of the capacitor 10 at a delayed timing. Thus, the stepped-up voltage V$_{BST1}$ is outputted.

Figure 7A:
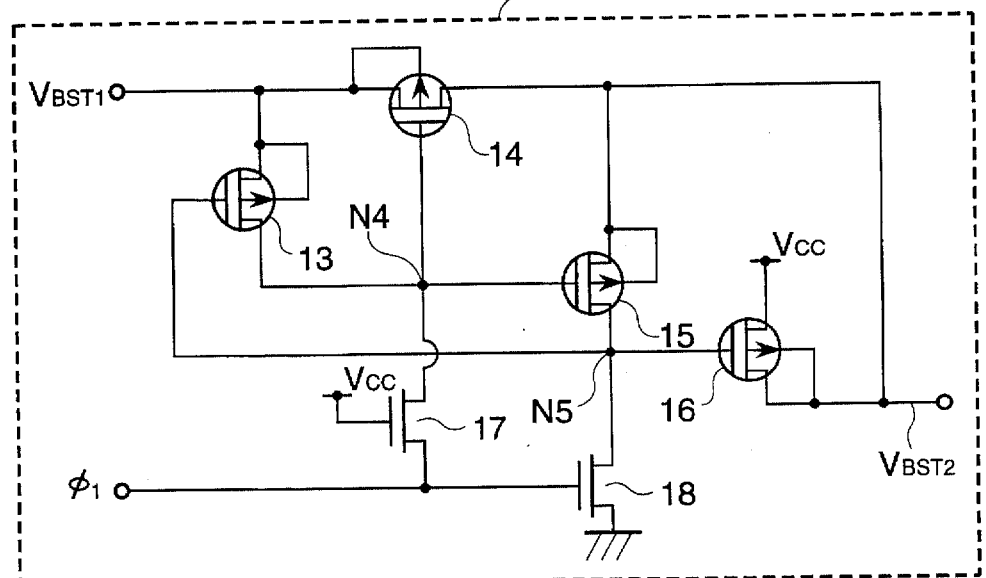
FIG. 7A is a circuit diagram of the voltage selecting circuit used in the voltage step-up control circuit shown in FIG. 4.

Referring to FIG. 7A, there is shown a circuit diagram of the voltage selecting circuit 103 used in the voltage step-up control circuit shown in FIG. 4.

The voltage selecting circuit 103 includes P-channel transistors 13, 14, 15 and 16 and N-channel transistors 17 and 18, connected as shown. Specifically, the stepped-up voltage V$_{BST1}$ is applied to a source of each of the P-channel transistors 13 and 14, and the detection signal φ1 is applied to a source of the N-channel transistor 17 and a gate of the N-channel transistor 18, which has a source is connected to the ground. A gate of the N-channel transistor 17 is connected to the power supply voltage Vcc.

A drain of the P-channel transistor 13 is connected to a node N4, which is connected to a drain of the N-channel transistor 17, a gate of the P-channel transistor 14, and a gate of the P-channel transistor 15. A drain of the P-channel transistor 14 is connected to an output of the voltage selecting circuit 103 for outputting the output voltage V$_{BST2}$. The drain of the P-channel transistor 14 is also connected to a source of the P-channel transistor 15, which has a drain connected to a node N5. This node N5 is connected to a drain of the N-channel transistor 18, a gate of the P-channel transistor 13, and a gate of the P-channel transistor 16. A drain of the P-channel transistor 16 is connected to the power supply voltage Vcc, and a source of the P-channel transistor 16 is connected to the output of the voltage selecting circuit 103 for outputting the output voltage V$_{BST2}$.

With this construction, the voltage selecting circuit 103 selects either the stepped-up voltage VBST1 or the power supply voltage VCC on the basis of the detection signal $\phi_1$, and outputs the selected voltage as the output voltage VBST2.

Figure 7B:
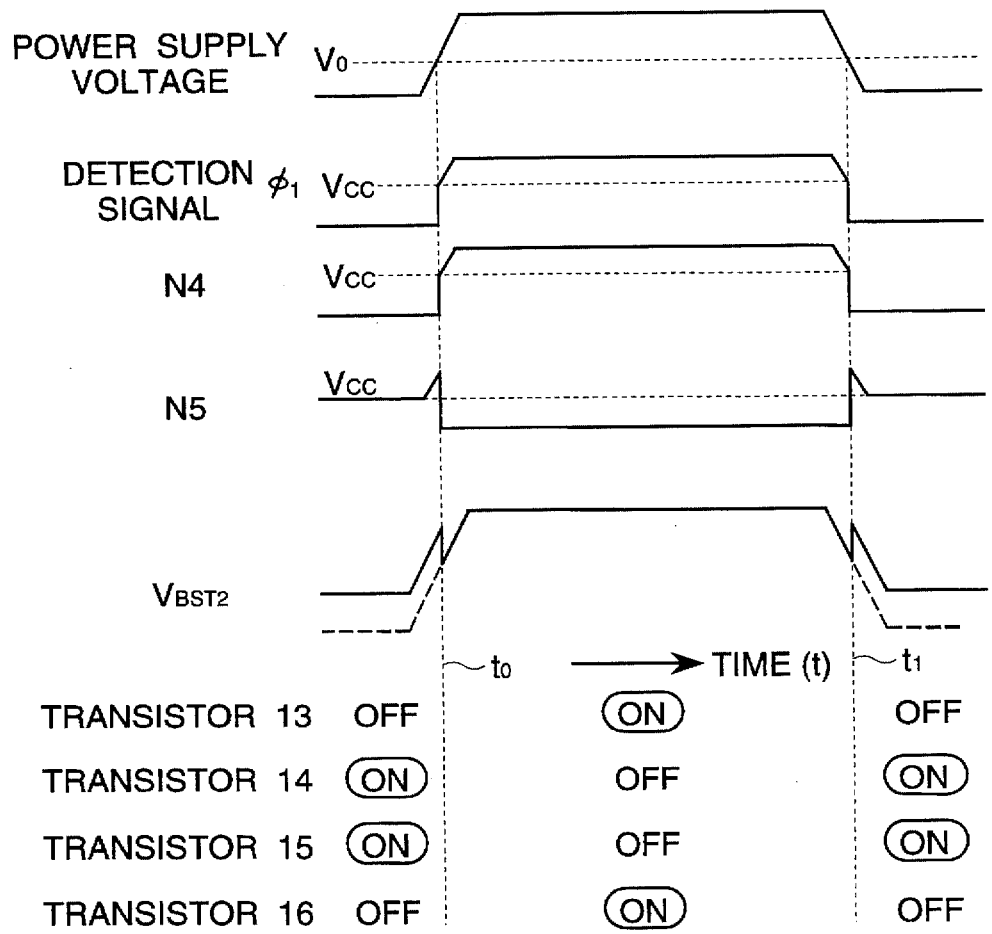
FIG. 7B is a waveform diagram illustrating an operation of the voltage selecting circuit shown in FIG. 7A.

Now, an operation of the voltage selecting circuit 103 will be described with reference to FIG. 7B, which is a waveform diagram illustrating the power supply voltage VCC, the detection signal $\phi_1$, voltage of the nodes N4 and N5 and the output voltage VBST1, and the on-off condition of the P-channel transistors 13 to 16.

When the detection signal $\phi_1$ changes from the low level to the high level at a time $t_0$, the N-channel transistor 18 is turned on, and the P-channel transistors 13 and 16 are turned on, so that the power supply voltage VCC is outputted as the output voltage VBST2. Since the P-channel transistor 13 is on, the P-channel transistors 14 and 15 are off.

On the other hand, when the detection signal $\phi_1$ changes from the high level to the low level at a time $t_1$, the N-channel transistor 18 is turned off and the N-channel transistor 17 is turned on. Therefore, the P-channel transistors 14 and 15 are turned on, and the P-channel transistors 13 and 16 are turned off. Thus, at this time, the stepped-up voltage VBST1 is outputted as the output voltage VBST2.

Accordingly, when the power supply voltage VCC is not higher than the predetermined reference voltage, the voltage selecting circuit 103 outputs the stepped-up voltage VBST1, or when the power supply voltage VCC is higher than the predetermined reference voltage, the voltage selecting circuit 103 outputs the power supply voltage VCC.

For example, when the voltage step-up control circuit is used a voltage step-up circuit for a word line of a static random access memory (static RAM), the reference level for the power supply voltage VCC in the power supply voltage detecting circuit 101 is set at an intermediate level between 5.0 V±10% of the 5 V product and 3.0 V±10% of the low voltage product. For example, the reference level is set to about 3.5 V. In this case, when the power supply voltage VCC is not higher than 3.5 V, the step-up voltage is applied to the word line, and when the power supply voltage VCC is higher than 3.5 V, the power supply voltage VCC is applied to the word line. Thus, an operation margin of the low voltage operation is ensured, and in addition, it is possible to prevent an excessive voltage from being applied to the word line. Therefore, unreliability can be avoided.

Now, a second embodiment of the voltage step-up control circuit will be described.

Figure 8A:
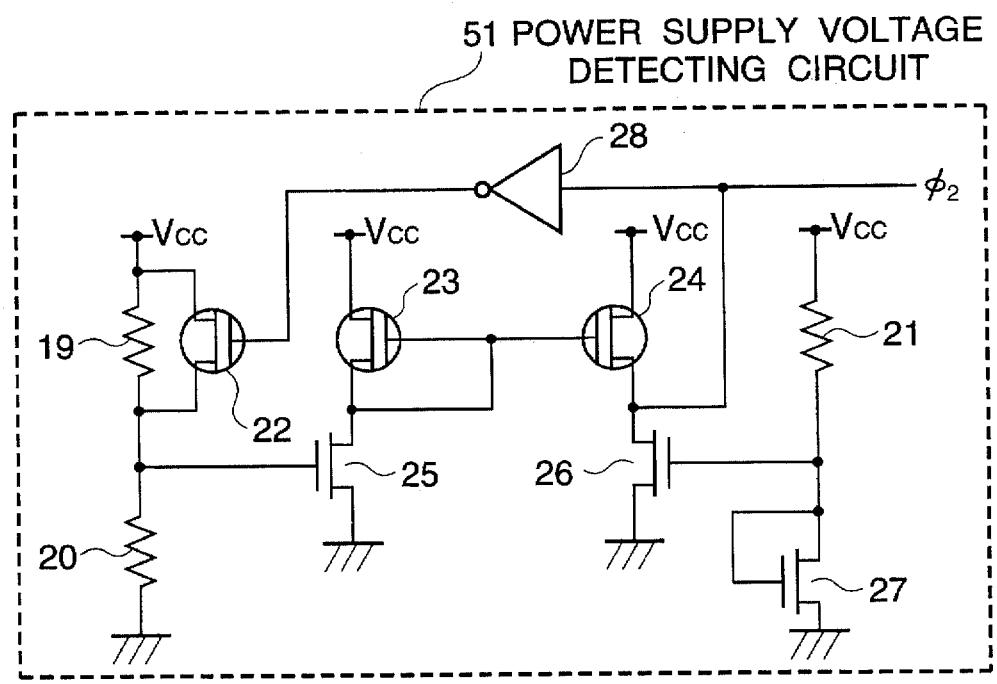
FIG. 8A is a circuit diagram of another example of the power supply voltage detecting circuit used in the voltage step-up control circuit shown in FIG. 4.

The first embodiment of the voltage step-up control circuit is so configured to have only one reference voltage Vo for the power supply voltage, In the first embodiment, the output voltage VBST2 is unstable when the power supply voltage becomes the reference voltage Vo in the process that the power supply voltage changes from a voltage lower than the reference voltage Vo to a voltage higher than the reference voltage Vo and in the process that the power supply voltage changes from a voltage higher than the reference voltage Vo to a voltage lower than the reference voltage Vo In order to overcome this problem, the second embodiment of the voltage step-up control circuit includes a power supply voltage detecting circuit 51 shown in FIG. 8A, in place of the power supply voltage detecting circuit 101 shown in FIG. 5A. Therefore, the second embodiment of the voltage step-up control circuit is the same as the first embodiment, except that the second embodiment of the voltage step-up control circuit includes the power supply voltage detecting circuit 51 shown in FIG. 8A.

In FIG. 8A, elements 19, 20, 21, 23, 24, 25, 26 and 27 correspond to the elements 1, 2, 3, 4, 5, 6, 7 and 8 shown in FIG. 5A, respectively, and a signal $\phi_2$ corresponds to the detection signal $\phi_1$.

As seen from comparison between FIGS. 5A and 8A, the second embodiment is characterized by comprising a P-channel transistor 22 connected in parallel to the resistor 19 and having a gate connected to receive the detection signal $\phi_2$ through an inverter 28. With this arrangement, when the detection signal $\phi_2$ is at the high level, the P-channel transistor 22 is turned on, so that the resistor 19 is shunted by the P-channel transistor 22. Thus, under a given power supply voltage VCC, a voltage on the gate of the transistor 25 when the P-channel transistor 22 is on, is higher than a voltage on the gate of the transistor 25 when the P-channel transistor 22 is off. In other words, a minimum power supply voltage VCC for turning on the transistor 25 when the P-channel transistor 22 is on, is lower than a minimum power supply voltage VCC for turning on the transistor 25 when the P-channel transistor 22 is off.

Figure 8B:
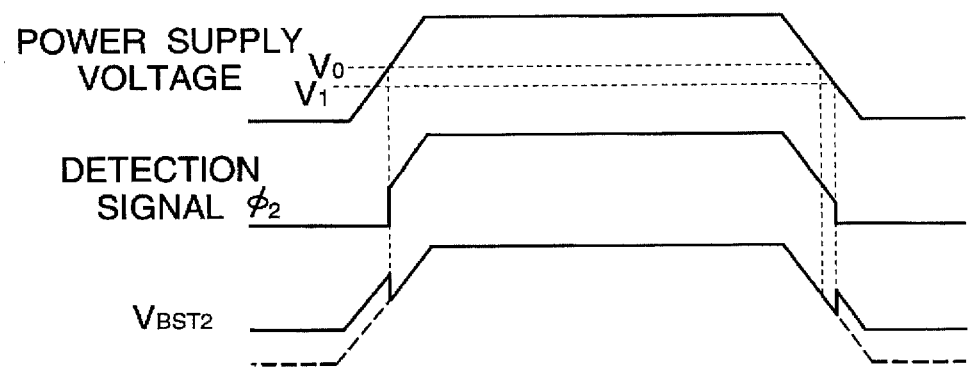
FIG. 8B is a waveform diagram illustrating an operation of the power supply voltage detecting circuit shown in FIG. 8A.

FIG. 8B is a waveform diagram illustrating the power supply voltage VCC, the detection signal $\phi_2$ and the output voltage VBST2. In FIG. 8B, a first reference voltage Vo is the same as the reference voltage Vo in the first embodiment, and a second reference voltage V1 is determined by a characteristics function of the transistor 22, as will be seen from the above description, and is lower than the first reference voltage Vo.

When the power supply voltage VCC is low, the detection signal $\phi_2$ is at the low level, and therefore, the transistor 22 is off. In the course that the power supply voltage VCC changes from a low voltage to a high voltage, when the power supply voltage VCC reaches the first reference voltage Vo, the detection signal $\phi_2$ is brought to the high level, so that the power supply voltage VCC is outputted as the output voltage VBST2. At this time, since the detection signal $\phi_2$ is at the high level, the transistor 22 is on. In the course that the power supply voltage VCC changes from this condition to a low voltage, when the power supply voltage VCC reaches the second reference voltage V1, the detection signal $\phi_2$ is brought to the low level, so that the stepped-up voltage VBST1 is outputted as the output voltage VBST2.

As seen from the above, since the reference voltage when the power supply voltage VCC changes from a low voltage to a high voltage is different from the reference voltage when the power supply voltage VCC changes from a high voltage to a low voltage, the above mentioned problem of instability can be prevented.

As seen from the above, the voltage step-up control circuit in accordance with the present invention detects the power supply voltage, and supplies the stepped-up voltage only when the power supply voltage is not higher than the predetermined reference voltage, and supplies the power supply voltage when the power supply voltage as it is higher than the predetermined reference voltage. Therefore, in the case that the voltage step-up control circuit in accordance with the present invention is used as the word line voltage step-up circuit in the memory, since the power supply voltage can be supplied to the word line when the power supply voltage is high, it is possible to prevent deterioration or damage of the word line. Incidentally, the reference voltage of the power supply voltage detecting circuit is not limited to 3.5 V, and can be freely determined.

As described hereinbefore, the conventional voltage step-up control circuit explained hereinbefore is configured only to limit the step-up amount when the power supply voltage is sufficient. In other words, the conventional voltage step-up control circuit steps up the power supply voltage whatever power supply voltage is applied. Therefore, potentials on various points in the semiconductor device are influenced by variation of circuit elements, and therefore, cannot be controlled from an external. Accordingly, a voltage exceeding a required voltage is often applied to the circuit elements, damages to the circuit elements. This means that the conventional voltage step-up control circuit explained hereinbefore ignores when a voltage damaging to the circuit elements is applied.

On the other hand, when the power supply voltage higher than the reference voltage is applied, the voltage step-up control circuit in accordance with the present invention supplies the power supply voltage to the circuit elements, and therefore, the upper limit of the voltage applied to the circuit elements can be controlled from an external, so as to prevent damage to the circuit elements. Therefore, reliability can be elevated.

The invention has thus been shown and described with reference to the specific embodiments. However, it should be noted that the present invention is in no way limited to the details of the illustrated structures but changes and modifications may be made within the scope of the appended claims.

I claim:

1. A semiconductor device comprising:
   a power supply voltage detecting circuit receiving a power supply voltage for outputting a detection signal which is activated when said power supply voltage is not higher than a predetermined reference level and which is deactivated when said power supply voltage is higher than a predetermined reference level;
   a voltage step-up circuit receiving said power supply voltage for stepping up said power supply voltage in response to a voltage step-up start signal, so as to output a stepped-up voltage; and
   a voltage selection circuit receiving said power supply voltage and said stepped-up voltage and controlled by said detection signal to output said stepped-up voltage when said detection signal is active and said power supply voltage when said detection signal is inactive.

2. A semiconductor device claimed in claim 1, wherein an output of said voltage selection circuit is connected to a word line of a static random access memory.

3. A semiconductor memory according to claim 2, wherein the selected word line is stepped-up depending on said power supply voltage,
   said power supply voltage comprising an external power supply voltage.

4. A semiconductor device claimed in claim 1, wherein said power supply voltage detecting circuit is configured to compare said power supply voltage with a first predetermined reference level when said power supply voltage changes from a low voltage to a high voltage, and to compare said power supply voltage with a second predetermined reference level when said power supply voltage changes from a high voltage to a low voltage,
   said first predetermined reference level being different from said second predetermined reference level.

5. A semiconductor memory according to claim 4, wherein said stepped-up voltage is supplied only when said power supply voltage is not higher than the first predetermined reference level, said power supply voltage comprising an external power supply voltage.

6. A semiconductor memory according to claim 1, wherein said power supply voltage comprises an external power supply voltage.

7. A semiconductor memory according to claim 1, wherein said stepped-up voltage is supplied only when said power supply voltage is not higher than the predetermined reference level,
   said power supply voltage comprising an external power supply voltage.

8. A semiconductor memory according to claim 7, wherein said voltage step-up circuit comprises:
   a first buffer for receiving said voltage step-up start signal; and
   a capacitor for receiving, at a first end, an output of said buffer.

9. A semiconductor memory according to claim 8, wherein said voltage step-up circuit further comprises:
   a delay circuit for receiving said voltage step-up start signal; and
   a second buffer for receiving an output of said delay circuit.

10. A semiconductor memory according to claim 9, wherein said second buffer provides an input to a second end of said capacitor, and
    wherein when said voltage step-up start signal is activated, said first buffer is driven to charge said capacitor and said second buffer is driven to charge said capacitor with a delay.

11. A semiconductor memory according to claim 7, wherein said voltage selection circuit comprises:
    first and second P-channel transistors for receiving at a source thereof said stepped-up voltage; and
    first and second N-channel transistors, said detection signal being applied to a source of said first N-channel transistor and to a gate of said second N-channel transistor,
    a gate of said first N-channel transistor being coupled to said power supply voltage and a source of said second N-channel transistor being coupled to ground.

12. A semiconductor memory according to claim 11, wherein said voltage selection circuit further comprises:
    a third P-channel transistor having a gate coupled to a drain of said first P-channel transistor,
    wherein said drain of said first P-channel transistor is connected to said third P-channel transistor via a node, said node being connected to a drain of said first N-channel transistor, a gate of said second P-channel transistor, and a gate of said third P-channel transistor.

13. A semiconductor device comprising:
    a voltage step-up control circuit receiving a power supply voltage for supplying a stepped-up voltage to at least one portion of an internal circuit,
    said voltage step-up control circuit being configured to supply said power supply voltage to said at least one portion of said internal circuit, in place of said stepped-up voltage, when said stepped-up voltage is higher than a predetermined reference level.

14. A semiconductor memory according to claim 13, wherein said power supply voltage comprises an external power supply voltage.

15. A semiconductor memory according to claim 13, wherein said stepped-up voltage is supplied only when said power supply voltage is not higher than the predetermined reference level,
    said power supply voltage comprising an external power supply voltage.

16. A semiconductor memory according to claim 13, wherein said at least one portion of said internal circuit is stepped up depending on said power supply voltage, said power supply voltage comprising an external power supply voltage.

17. A semiconductor memory comprising:

a voltage step-up control circuit receiving a power supply voltage for driving a word line with a stepped-up voltage, said voltage step-up control circuit being configured to drive said word line with said power supply voltage, in place of said stepped-up voltage, when said stepped-up voltage is higher than a predetermined reference level.

18. A semiconductor memory according to claim 17, wherein said power supply voltage comprises an external power supply voltage.

19. A semiconductor memory according to claim 17, wherein said stepped-up voltage is supplied only when said power supply voltage is not higher than the predetermined reference level, said power supply voltage comprising an external power supply voltage.

20. A semiconductor memory according to claim 17, wherein said word line is stepped-up depending on said power supply voltage, said power supply voltage comprising an external power supply voltage.

* * * * *